United States Patent [19]

Yang

[11] Patent Number: 5,554,543

[45] Date of Patent: Sep. 10, 1996

[54] PROCESS FOR FABRICATING BIPOLAR JUNCTION TRANSISTOR HAVING REDUCED PARASITIC CAPACITANCE

[75] Inventor: Sheng-Hsing Yang, Hsinchu, Taiwan

[73] Assignee: United Microelectronics Corporation, Hsinchu, Taiwan

[21] Appl. No.: 449,625

[22] Filed: May 24, 1995

[51] Int. Cl.$^6$ .................................................. H01L 21/265
[52] U.S. Cl. .................. 437/31; 437/30; 437/32; 437/33; 437/69; 437/917; 437/984; 148/DIG. 10; 257/575
[58] Field of Search ................. 437/31, 32, 33, 437/30, 69, 917, 984; 148/DIG. 10, DIG. 11; 257/575

[56] References Cited

U.S. PATENT DOCUMENTS

| | | |
|---|---|---|
| 4,521,952 | 6/1985 | Riseman ................................. 29/590 |
| 4,916,083 | 4/1990 | Monkowski et al. ................... 437/31 |
| 4,980,302 | 12/1990 | Shimizu .................................. 437/31 |
| 5,387,553 | 2/1995 | Moksvold et al. ...................... 437/32 |
| 5,455,188 | 10/1995 | Yang ....................................... 437/32 |
| 5,478,760 | 12/1995 | Yang ....................................... 437/31 |
| 5,482,873 | 1/1996 | Yang ....................................... 437/31 |
| 5,489,541 | 2/1996 | Yang et al. ............................. 437/31 |

*Primary Examiner*—George Fourson
*Assistant Examiner*—Long Pham
*Attorney, Agent, or Firm*—Townsend and Townsend and Crew

[57] ABSTRACT

A process for fabricating a BJT device on a semiconductor substrate is disclosed. The substrate serves as the collector. The process comprises the steps of, first, forming a shielding layer over the designated location over the surface of the substrate for defining the active region. The process further utilizes the shielding layer as the shielding mask for implanting impurities of into the substrate for forming an doped region. Then, a first field oxide layer is formed over the doped region and then removed. Sidewall spacers for the shielding layer are then formed. The process then utilizes the shielding layer and the sidewall spacers as the shielding mask for implanting impurities into portions of the doped region, forming a heavily-doped region, and the remaining portion of the doped region defines the base region. A second field oxide layer is then formed over the heavily-doped region. The sidewall spacers are then removed to form trenches in the places of the sidewall spacers. The process then forms emitter electrodes in the trenches, and then implants impurities into the base region via the emitter electrodes, thereby forming the emitter regions. The fabricated BJT has reduced inherent parasitic capacitance and improved switching speed characteristics.

7 Claims, 5 Drawing Sheets

PROCESS FOR FABRICATING BIPOLAR JUNCTION TRANSISTOR HAVING REDUCED PARASITIC CAPACITANCE

BACKGROUND OF THE INVENTION

1. Field of the Invention

The present invention relates in general to a process for fabricating bipolar junction transistors. In particular, the present invention relates to a process for fabricating bipolar junction transistors having fast switching speed.

2. Technical Background

Conventional semiconductor bipolar junction transistor (BJT) devices are characterized by the limitations in their feasible operation switching speed. At least several causes are responsible for this limited switching speed. One of them is the excessive parasitic capacitance found in the junction of the emitter region of the BJT device, and the other is the long distance that separates the emitter region and the contact region of the collector region thereof.

FIG. 1 of the accompanying drawing of the present invention schematically depicts the cross-sectional view of a conventional BJT device, which is utilized herein for the purpose of the description of the present invention.

Refer to FIG. 1. In a typical prior art process, the fabrication of a BJT device begins with an N-type semiconductor silicon substrate 1. The substrate 1 itself plays the role of the collector region for the BJT device being fabricated. A P-well 10 is then formed in the N-type substrate 1 that can be utilized as the base region of the BJT. Within this basic structural configuration, N-type emitter 12, P+-type contact region 14 for the P-type base region 10, and the N+-type contact region 16 for the N-type collector 1 are formed as is seen in the drawing of FIG. 1.

As is depicted in the drawing, which, although not drawn to the exact scale, does schematically show the structural configuration of the BJT device fabricated in the conventional process, it can be found that the surface area of the emitter region 12 is relatively large resulting in the presence of parasitic capacitance between its junction with the P-type base region 10. On the other hand, the distance from the emitter region 12 to the contact region 16 of the collector region 1 is excessively long, this places a restriction on the possible device switching speed that may be attained. Further, this long distance also is a factor that restricts the possible amount of device gain level.

SUMMARY OF THE INVENTION

It is therefore an object of the present invention to provide a process for fabricating bipolar junction transistor devices that have improved high switching speed operating characteristics.

It is another object of the present invention to provide a process for fabricating bipolar junction transistor devices that have improved gain.

The present invention achieves the above-identified objects by providing a process for fabricating a BJT device on a semiconductor substrate. The substrate serves as the collector for the BJT device. The process comprises the steps of, first, forming a shielding layer over the designated location over the surface of the substrate for defining the active region of the BJT device. The process further utilizes the shielding layer as the shielding mask for implanting impurities into the substrate for forming a doped region. Then, a first field oxide layer is formed over the doped region and then removed. Sidewall spacers for the shielding layer are then formed. The process then utilizes the shielding layer and the sidewall spacers as the shielding mask for implanting impurities into portions of the doped region, forming a heavily-doped region, and the remaining portion of the doped region defines the base region for the BJT device. A second field oxide layer is then formed over the heavily-doped region. The sidewall spacers are then removed to form trenches in the places of the sidewall spacers. The process then forms emitter electrodes for the BJT device in the trenches, and then implants impurities into the base region via the emitter electrodes, thereby forming the emitter regions for the BJT device. Then the contact region for the collector region of the BJT device is formed. The fabricated BJT has the reduced inherent parasitic capacitance in the junction region, as well as improved switching speed characteristics.

BRIEF DESCRIPTION OF THE DRAWINGS

Other objects, features, and advantages of the present invention will become apparent by way of the following detailed description of the preferred but non-limiting embodiments. The description is made with reference to the accompanied drawings in which.

DETAILED DESCRIPTION OF THE PREFERRED EMBODIMENT

Figure 1:
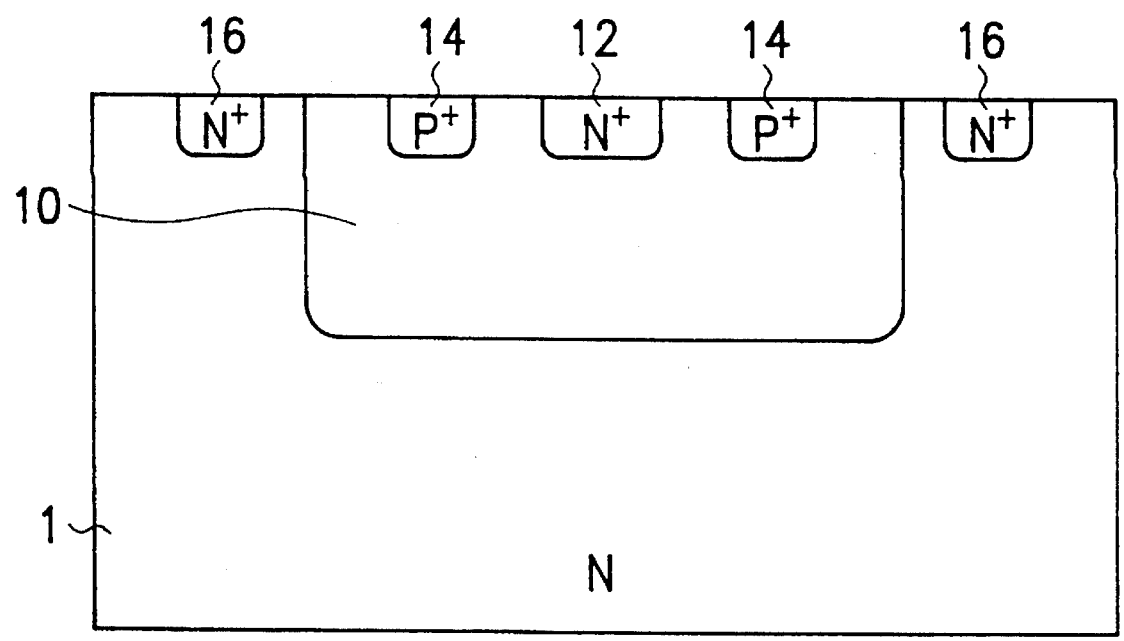
FIG. 1 schematically shows the cross-sectional view of a conventional bipolar junction transistor.

Refer to FIGS. 2a–2g of the drawing. The selected cross-sectional views schematically show the structural configuration of a bipolar junction transistor fabricated in accordance with a preferred embodiment of the present invention as depicted from the process stages of its fabrication. The process of the present invention is suitable for the fabrication of BJT devices on a desired type, either P- or N-type, of the semiconductor substrate, a P- or N-well region on a substrate, or an epitaxially grown layer, although in the exemplified embodiment of FIGS. 2a–2g a N-type substrate 2 is employed as the basis for the fabrication. The N-type substrate 2 also serves the function of the collector region for the BJT device to be fabricated. The process of fabrication is described in the following process stages.

Stage 1

Figure 2A:
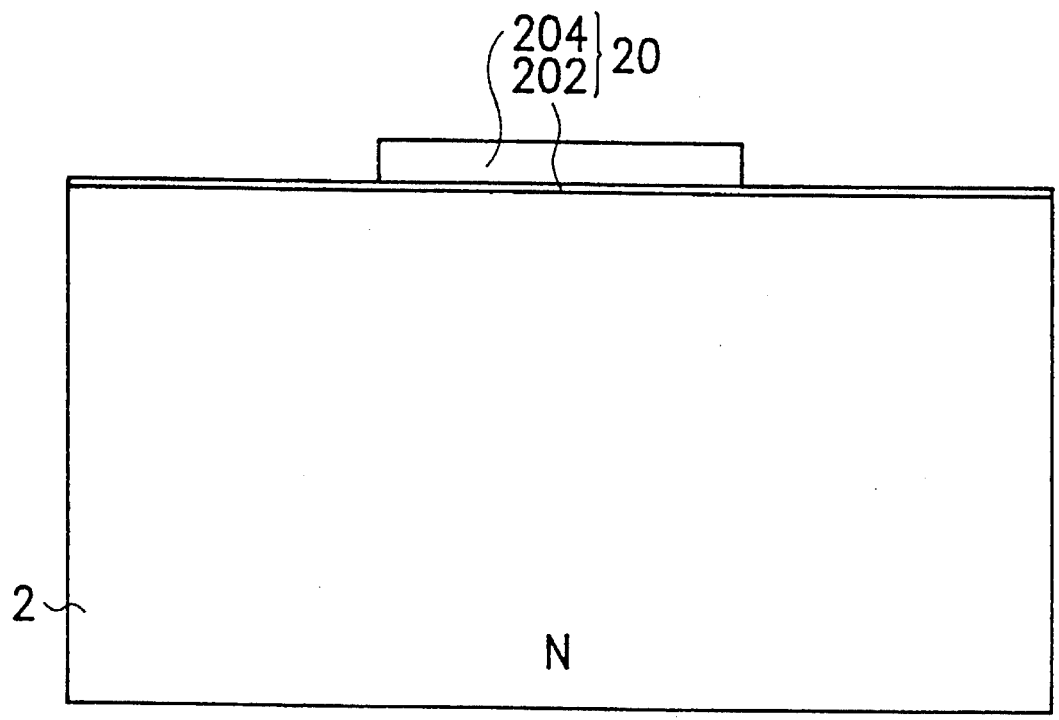
FIGS. 2a–2g schematically show the cross-sectional view of a bipolar junction transistor fabricated in accordance with a preferred embodiment of the present invention as depicted from the process stages of its fabrication.

Refer to FIG. 2a. At the first stage, a semiconductor substrate 2 of the first conductivity type is has its designated surface areas formed and covered by a shielding layer 20, so as to define the active region for the BJT device to be fabricated.

This can be done by, for example, growing a layer of pad oxide 202, followed by the deposition of the a nitride layer 204 thereon. A photolithography procedure may then be employed to form the shielding layer 20, which comprise the pad oxide 202 and the nitride layer 204, with its designated shielding pattern in a controlled etching process.

Stage 2

Figure 2B:
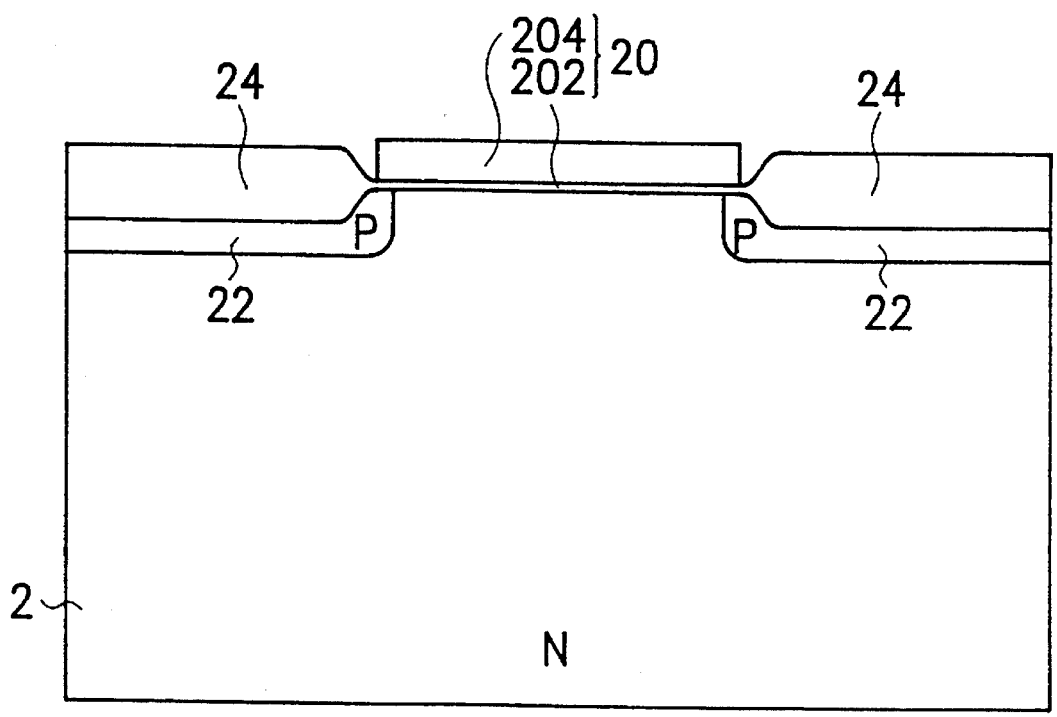

Refer next to FIG. 2b. The shielding layer 20 is then utilized as the shielding mask for the implementation of an impurity implantation to implant impurities of the second conductivity type into the selected depth level of the semiconductor substrate 2 of the first conductivity type. As a result of this implantation, a doped region 22 of the second conductivity type is formed, as is seen in the drawing. Then, a first field oxide layer 24 is subsequently formed on the doped region 22. Afterwards, the first field oxide layer 24 may then be removed.

This can be achieved by, for example, applying an ion implantation procedure to implant P-type impurities into the controlled depth level of the N-type substrate 2. A thermal drive-in procedure may then be performed to further assist in placing the P-type impurities to the desired depth level of the N-type substrate 2. A first field oxide layer 24 is then formed over the surface of the doped region 22 by, for example, performing a thermal oxidation procedure that oxidizes the pad oxide layer 202 of the shielding layer 20 of FIG. 2a that is exposed out of the coverage of the nitride layer 204. The first field oxide layer 24 is removed immediately after it is formed.

Stage 3

Figure 2C:
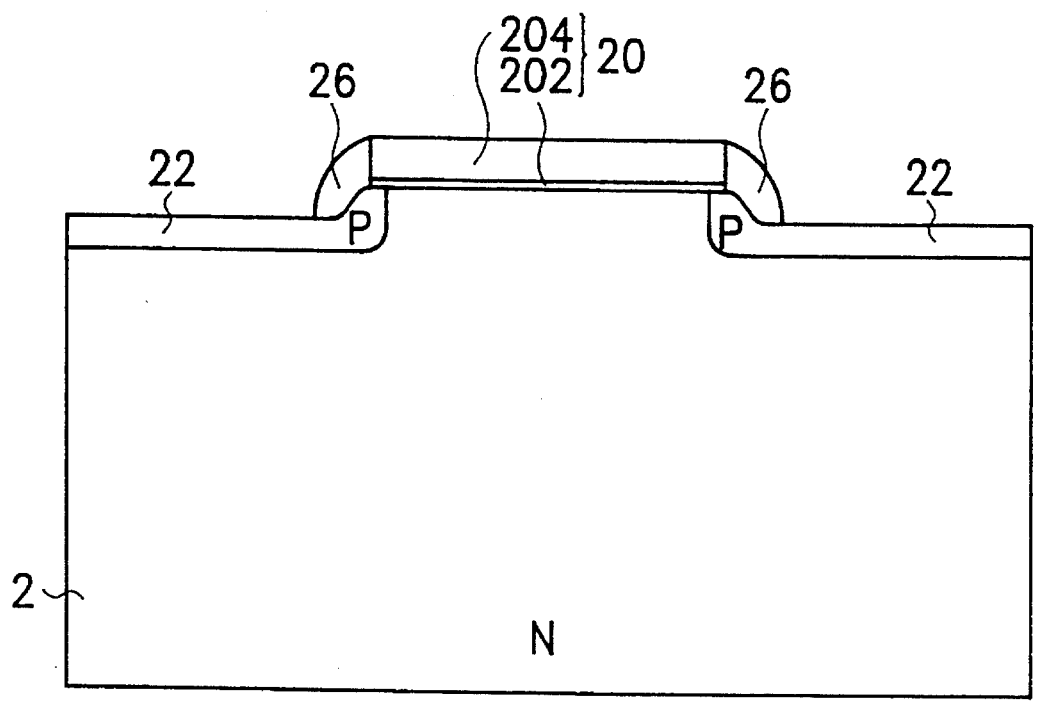

Next, refer to FIG. 2c. Sidewall spacers 26 are then formed to cover the exposed sidewalls of the shielding layer 20.

This can be done by, for example, depositing a layer of nitride over the surface of the substrate 2 at this stage, and then performing an etching-back procedure that retains only the nitride layer over the sidewall of the shielding layer 20.

Stage 4

Figure 2D:
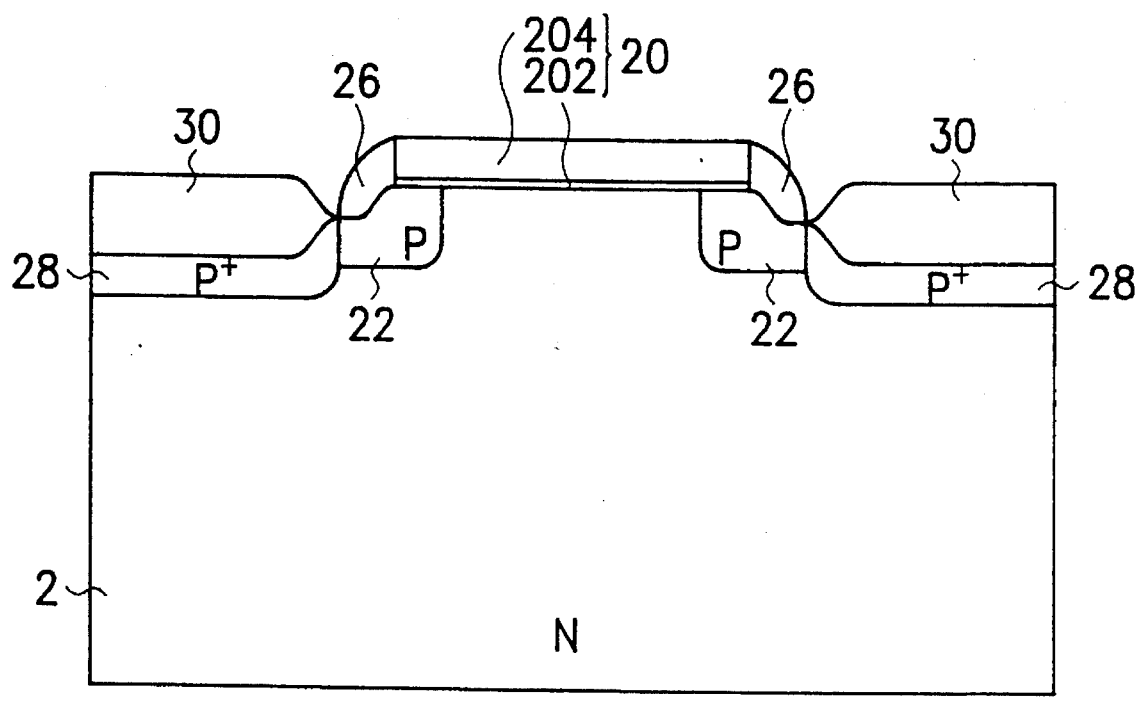

Then, in FIG. 2d, the shielding layer 20, along with its sidewall spacers 26, is utilized as the shielding mask for the implanting impurities of the second conductivity type into the doped region 22 of the second conductivity type. This forms the heavily-doped region 28 of the second conductivity type out of the exposed portion of the doped region 22, as is shown in the drawing. The doped region 22 of the second conductivity type, with its reduced size, forms the base region for the BJT device being fabricated. Thereafter, a second field oxide layer 30 is then formed over the surface of the heavily-doped region 28 of the second conductivity type.

This can be done by, for example, implanting P-type impurities into the regions of the P-type doped region 22 that is exposed out of the shielding of the shielding layer 20 with its additional sidewall spacers 26. A thermal drive-in procedure may then be employed to further drive in the P-type impurities to the desired depth level, so as to form the P-type heavily-doped region 28. After the formation of the heavily-doped region 28, a second field oxide layer 30 is further formed over the region 28.

Stage 5

Figure 2E:
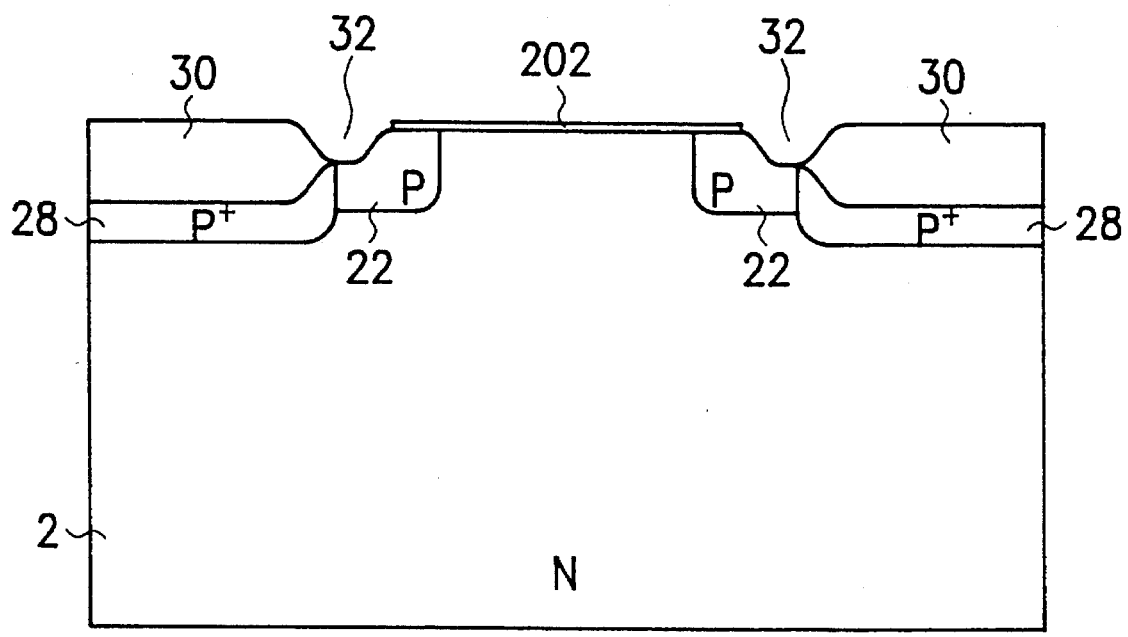

Then, refer to FIG. 2e. The sidewall spacers 26 of the shielding layer 20 are then removed to form the trenches 32.

This can be done by, for example, removing the sidewall spacers 26, along with the nitride layer 204 of the shielding layer 20. The sidewall spacers 26 may be removed simultaneously with the nitride layer 204, since they are both formed of nitride. This allows the formation of the trenches 32 that connect between the pad oxide 202 and the second field oxide layers 30.

Stage 6

Figure 2F:
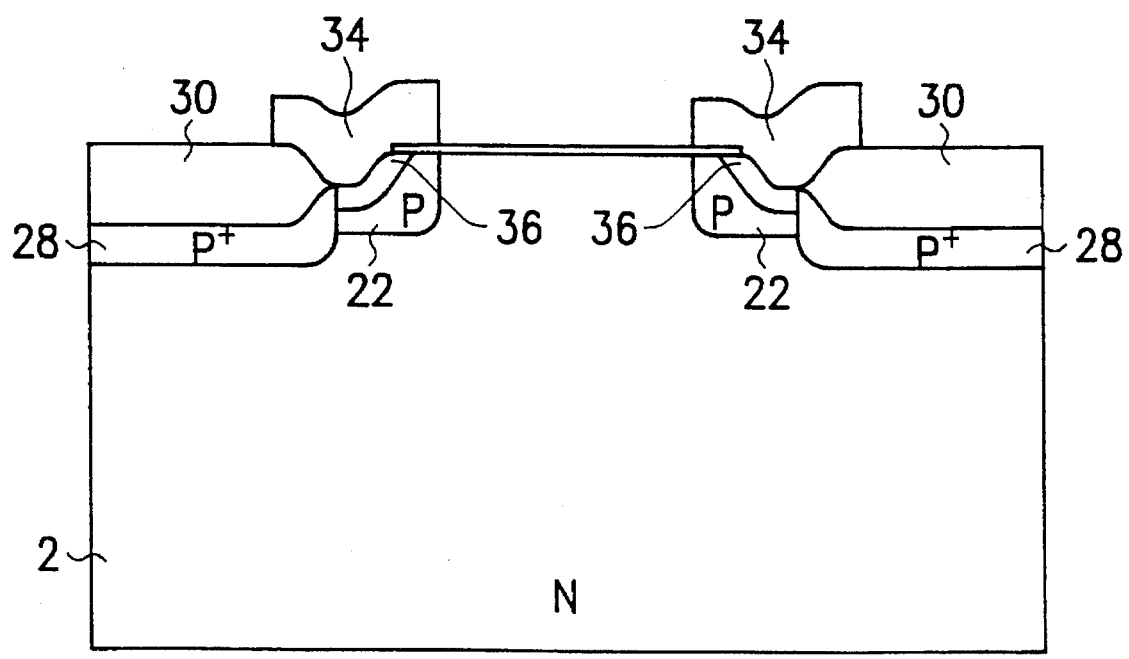

Next, in FIG. 2f, the emitter electrodes 34 may then be formed over the trenches 32, and the emitter region 36 for the BJT device being fabricated may be formed by implanting impurities of the first conductivity type into the base region of the BJT, which is the doped region 22 of the second conductivity type formed as described above.

This may be achieved by, for example, depositing a polysilicon layer over the surface of the substrate 2 at this stage, and then implanting N-type impurities therein the deposited polysilicon layer. An annealing procedure may then be performed to allow for the diffusion of the implanted N-type impurities into the region of the P-type doped region 22. This allows for the formation of the N+-type doped region 36, which functions as the emitter for the BJT device being fabricated. Afterwards, a photolithography procedure may then be employed to etch the deposited polysilicon layer into the shape of the emitter electrode 34 as shown.

Stage 7

Figure 2G:
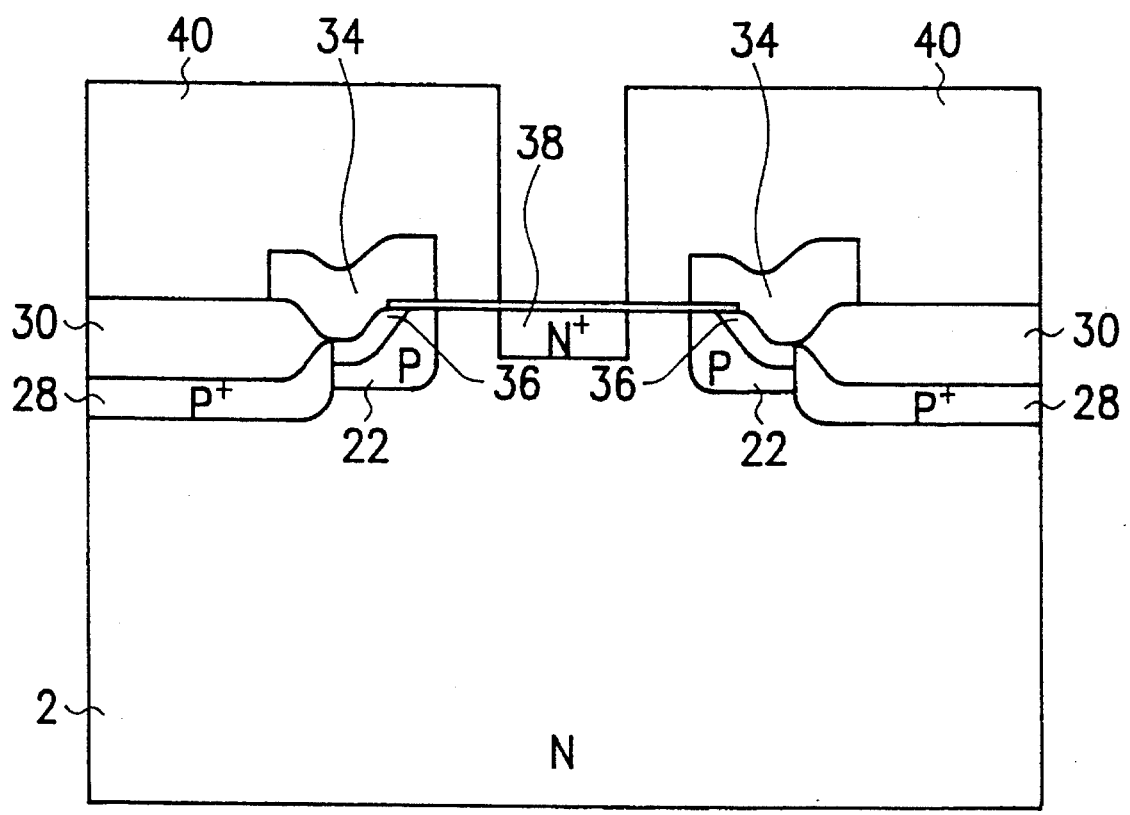

Finally in FIG. 2g, a contact region 38 is formed for the collector region 2, which is the substrate 2 of the BJT device being fabricated.

This can be achieved by, for example, deploying a photoresist layer 40 with its designated pattern for use as a shielding mask that allows for the implantation of N-type impurities into the controlled depth level of the N-type substrate 2. This allows for the formation of the contact region 38 that stands between the emitter regions 36 of the BJT device being fabricated.

This generally concludes the process for fabricating the BJT device of the present invention. Due to the fact that the formation of the emitter region for the BJT is implemented by diffusing impurities of the required type into the base region via the emitter electrode of the BJT device, it therefore achieves a very desirable result that the emitter region of the BJT can 30 have a contact region that is confined within a relatively small surface area. This reduces the parasitic capacitance inherent in the junction region.

On the other hand, since the contact region for the emitter of the BJT device is located between the emitter regions thereof, the distance between the contact regions for the emitter and collector regions of the fabricated BJT device can be reduced to the shortest possible, which is a beneficial factor for increasing the operation switching speed of the BJT device.

Thus, the process of fabricating BJT devices as disclosed by the present invention is advantageous for the reduction of the inherent parasitic capacitance within the junctions, as well as the improved device operation switching speed. Although a specific embodiment is exemplified in the descriptive paragraphs outlined above, persons skilled in the art, however, can appreciate the fact that most of the modifications to the embodiments as disclosed should still be considered to be within the scope of the present invention, which is recited in the claims that follow.

What is claimed is:

1. A process for fabricating a bipolar junction transistor device on a semiconductor substrate of a first conductivity type, wherein said substrate serves as a collector for said bipolar junction transistor device, comprising:

forming a shielding layer with designated pattern on said substrate;

implanting impurities of a second conductivity type into said substrate to form doped regions by utilizing said shielding layer as masking;

forming a first oxide layer over said doped regions through a first thermal oxidation;

removing said first oxide layer;

forming spacers on the sidewalls of said shielding layer;

implanting impurities of the second conductivity type into said substrate to form heavily-doped regions by utilizing said shielding layer and spacers as masking;

forming a second oxide layer over said heavily-doped regions through a second oxidation;

removing said spacers to form trenches in places of said spacers;

forming emitter electrodes on said doped regions via said trenches, and forming emitter regions of the first conductivity type beneath said emitter electrodes; and forming a contact region of the first conductivity type in said collector.

2. The process for fabricating said bipolar junction transistor device of claim 1, wherein the step of forming said shielding layer comprises: forming a pad oxide layer and depositing a nitride layer thereon.

3. The process for fabricating said bipolar junction transistor device of claim 2, wherein the step of removing said spacers further removes said nitride layer of said shielding layer.

4. The process for fabricating said bipolar junction transistor device of claim 1, wherein the step of forming said spacers comprises:

depositing a nitride layer on overall surface; and etching back said nitride layer to form said spacers.

5. The process for fabricating said bipolar junction transistor device of claim 1, wherein said emitter electrodes are made of polysilicon.

6. The process for fabricating said bipolar junction transistor device of claim 1 wherein said first conductivity type is N-type and said second conductivity type is P-type.

7. The process for fabricating said bipolar junction transistor device of claim 1 wherein said first conductivity type is P-type and said second conductivity type is N-type.

\* \* \* \* \*